(12) United States Patent
Karasawa et al.

(10) Patent No.: US 12,463,101 B2
(45) Date of Patent: Nov. 4, 2025

(54) WIRING BOARD ASSEMBLY, WIRING BOARD, AND WIRING BOARD MANUFACTURING METHOD

(71) Applicant: SHINKO ELECTRIC INDUSTRIES CO., LTD., Nagano (JP)

(72) Inventors: Yu Karasawa, Nagano (JP); Ryo Miyazawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 116 days.

(21) Appl. No.: 18/356,413

(22) Filed: Jul. 21, 2023

(65) Prior Publication Data

US 2024/0047283 A1   Feb. 8, 2024

(30) Foreign Application Priority Data

Aug. 3, 2022   (JP) .................................. 2022-124328

(51) Int. Cl.
 *H01L 23/13*   (2006.01)
 *H01L 21/48*   (2006.01)
 *H01L 23/498*  (2006.01)

(52) U.S. Cl.
 CPC ............ *H01L 23/13* (2013.01); *H01L 21/486* (2013.01); *H01L 23/49827* (2013.01)

(58) Field of Classification Search
 CPC . H01L 23/13; H01L 21/486; H01L 23/49827; H01L 23/49811; H01L 23/49894; H01L 23/49822; H01L 21/02021; H05K 3/1208; H05K 3/0097; H05K 3/0052; H05K 3/3452
 USPC .......................................... 174/255
 See application file for complete search history.

(56) References Cited

U.S. PATENT DOCUMENTS

2013/0025914 A1*  1/2013  Naganuma ........... H05K 3/4694
                                                29/830
2013/0107481 A1*  5/2013  Shimizu .............. H01L 23/5389
                                                361/761

FOREIGN PATENT DOCUMENTS

JP   2001-160597 A   6/2001

* cited by examiner

*Primary Examiner* — Timothy J Thompson
*Assistant Examiner* — Sidi M Maiga
(74) *Attorney, Agent, or Firm* — Rankin, Hill & Clark LLP

(57) ABSTRACT

A wiring board assembly includes a wiring structure and an insulating layer. The insulating layer covers a surface of the wiring structure and includes a slit that exposes a predetermined region on the surface of the wiring structure. An edge portion of the outermost insulating layer corresponding to the edge portion of the slit meanders in a wave-like manner.

7 Claims, 11 Drawing Sheets

WIRING BOARD ASSEMBLY, WIRING BOARD, AND WIRING BOARD MANUFACTURING METHOD

CROSS-REFERENCE TO RELATED APPLICATION

This application is based upon and claims the benefit of priority of the prior Japanese Patent Application No. 2022-124328, filed on Aug. 3, 2022, the entire contents of which are incorporated herein by reference.

FIELD

The embodiment discussed herein is related to a wiring board assembly, a wiring board, and a wiring board manufacturing method.

BACKGROUND

Conventionally, a wiring board for mounting a semiconductor chip is not individually manufactured, but manufactured as an assembly in which a plurality of wiring boards are arrayed. The plurality of wiring boards that are manufactured as an assembly are diced into individual pieces by being cut by a cutting tool, such as a dicer or a slicer, for example. Each of the wiring boards obtained by dicing serves as a wiring board for mounting a semiconductor chip.

When the assembly is diced, it is common to cut a solder resist layer that covers a wiring structure of a wiring board together with the wiring structure by a cutting tool. In the solder resist layer, a damage, such as chipping or cracking, may occur due to contact with the cutting tool. To cope with this, it may be possible to form a linear slit with a wider width than a cutting tool on the solder resist layer in accordance with a cut region to be cut on a surface of the wiring structure, and cut the wiring structure in the cut region that is exposed from the linear slit to dice the assembly into individual pieces. By cutting the wiring structure in the cut region that is exposed from the linear slit in the solder resist layer, it is possible to avoid contact between the solder resist layer and the cutting tool, so that it is possible to prevent occurrence of a damage in the solder resist layer.

However, when the wiring structure is cut in the cut region that is exposed from the linear silt in the solder resist layer, there is a problem in that the solder resist layer and the wiring structure may be detached from each other. Specifically, in the cut region that is exposed from the linear slit in the solder resist layer, a surface of the wiring structure is not covered by the solder resist layer, so that a load that acts on the wiring structure from the cutting tool increases in a direction away from the solder resist layer. As a result, the solder resist layer and the wiring structure are detached from each other.

Further, in a structure in which the slit is formed so as to be wider than the cut region to avoid contact between the solder resist layer and the cutting tool (a structure as described in Japanese Laid-open Patent Publication No. 2001-160597), a load that acts on the wiring structure from the cutting tool is applied to the surface of the wiring structure that is not protected by the solder resist layer. Therefore, a damage, such as chipping or cracking, may occur on the surface of the wiring structure that is not protected by the solder resist layer.

SUMMARY

According to an aspect of an embodiment, a wiring board assembly includes a wiring structure that includes a wiring layer and an insulating layer; and an outermost insulating layer that covers a surface of the wiring structure and includes a slit that exposes a predetermined region on the surface of the wiring structure, wherein an edge portion of the outermost insulating layer corresponding to an edge portion of the slit meanders in a wave-like manner.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Embodiments of a wiring board assembly, a wiring board, and a wiring board manufacturing method disclosed in the present application will be described in detail below based on the drawings. The disclosed technology is not limited by the embodiment below.

Figure 1:
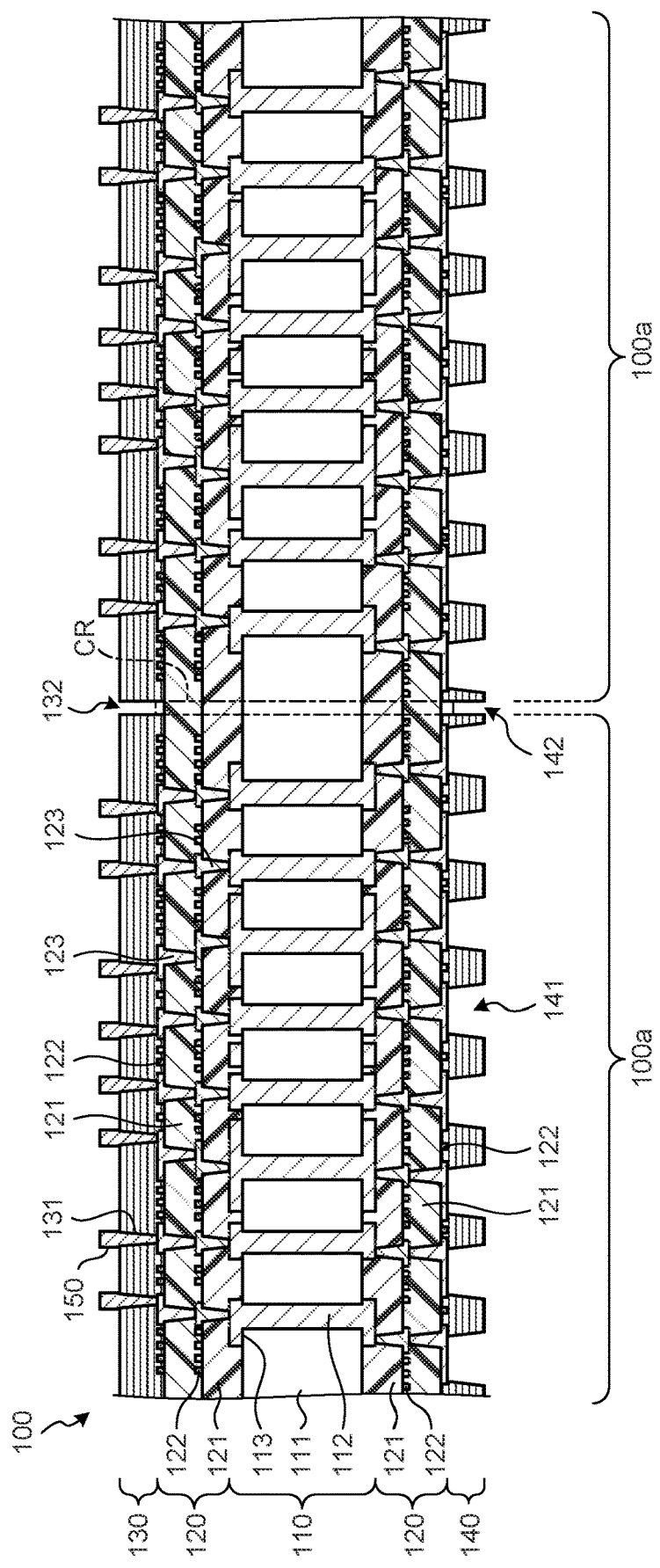
FIG. 1 is a schematic cross-sectional view illustrating a configuration of a wiring board assembly according to one embodiment.

FIG. 1 is a schematic cross-sectional view illustrating a configuration of a wiring board assembly 100 according to one embodiment. The wiring board assembly 100 is an assembly in which a plurality of wiring boards 100*a* are arrayed. The plurality of wiring boards 100*a* that are manufactured as the wiring board assembly 100 are cut into individual pieces by, for example, a cutting tool, such as a dicer or a slicer, in a cut region CR that is formed in a lattice manner, for example.

The wiring board assembly 100 has a layer structure and includes a core substrate 110, wiring structures 120, and solder resist layers 130 and 140. In the following, as illustrated in FIG. 1, explanation will be given based on the assumption that the solder resist layer 140 serves as a lowermost layer and the solder resist layer 130 serves as an uppermost layer; however, the wiring board assembly 100 may be used upside down and may be used in an arbitrary posture, for example.

The core substrate 110 is formed by forming wiring layers 113 by metal plating on both surfaces of a base material 111 that is a plate-shaped insulator. The wiring layers 113 on the both surfaces are connected to each other via vias 112 that penetrate through the base material 111, on an as-needed basis.

The wiring structure 120 is formed by laminating layers including an insulating layer 121 with insulating property and a wiring layer 122 with conductive property. The insulating layer 121 is formed by using, for example, insulating resin, such as epoxy resin or polyimide resin. Further, the wiring layer 122 is formed by using, for example, metal, such as copper or a copper alloy. In FIG. 1, two layers are laminated in the wiring structure 120 in an upper part of the core substrate 110 and two layers are laminated on the wiring structure 120 in a lower part of the core substrate 110, but the number of layers to be laminated may be one or may be three or more. The wiring layers 113 and 122 that are adjacent to each other via the insulating layer 121 are connected to each other via vias 123 that penetrate through the insulating layer 121, on an as-needed basis.

The solder resist layer 130 is a layer that covers the wiring layer 122 on the surface of the wiring structure 120 and protects wires. The solder resist layer 130 is a layer that is made of, for example, insulating photosensitive resin, such as acrylic resin or polyimide resin, and is one of insulating layers. The solder resist layer 130 is one example of an outermost insulating layer.

A surface of the wiring board assembly 100 at the side of the solder resist layer 130 is a surface on which an electronic component, such as a semiconductor chip, is mounted, for example. At positions on which the semiconductor chip is mounted, opening portions 131 are formed in the solder resist layer 130. The solder resist layer 130 is formed by using photosensitive resin, so that it is possible to form the opening portions 131 by exposure and development. Further, in the opening portions 131, connecting terminals 150 that connect the wiring layer 122 of the wiring structure 120 and electrodes of the semiconductor chip are formed.

Furthermore, the solder resist layer 130 includes slits 132 that correspond to the cut region CR on the surface of the wiring structure 120. In the slits 132, the cut region CR on the surface of the wiring structure 120 is exposed. The solder resist layer 130 is formed by using photosensitive resin, so that it is possible to form the slits 132 together with the opening portions 131 by exposure and development.

The solder resist layer 140 is a layer that covers the wiring layer 122 on the surface of the wiring structure 120 and protects wires, similarly to the solder resist layer 130. The solder resist layer 140 is a layer that is made of, for example, insulating photosensitive resin, such as acrylic resin or polyimide resin, and is one of the insulating layers. The solder resist layer 140 is one example of the outermost insulating layer.

A surface of the wiring board assembly 100 at the side of the solder resist layer 140 is a surface that is electrically connected to an external component or an external apparatus. At positions at which external connecting terminals that are electrically connected to an external component or an external apparatus are formed, opening portions 141 are formed in the solder resist layer 140, and the wiring layer 122 of the wiring structure 120 is exposed from the opening portions 141. In the opening portions 141, for example, external connecting terminals, such as solder balls, are formed. The solder resist layer 140 is formed by using photosensitive resin, so that it is possible to form the opening portions 141 by exposure and development.

Furthermore, the solder resist layer 140 includes slits 142 that correspond to the cut region CR on the surface of the wiring structure 120. In the slits 142, the cut region CR on the surface of the wiring structure 120 is exposed. The solder resist layer 140 is formed by using photosensitive resin, so that it is possible to form the slits 142 together with the opening portions 141 by exposure and development.

Figure 2:
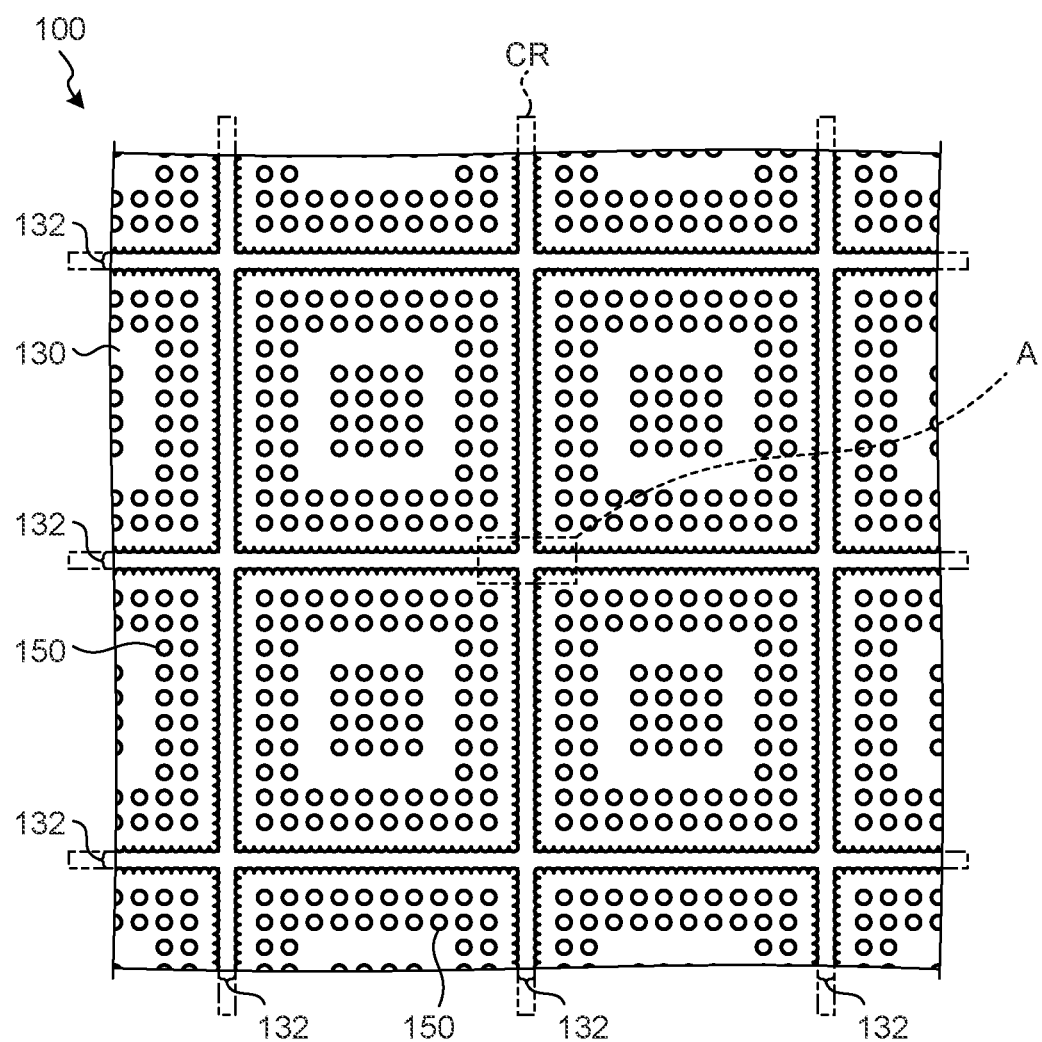
FIG. 2 is a plan view illustrating the configuration of the wiring board assembly according to one embodiment.

FIG. 2 is a plan view illustrating a configuration of the wiring board assembly 100 according to one embodiment. In FIG. 2, a top view of the wiring board assembly 100 viewed from the solder resist layer 130 side is illustrated. As illustrated in FIG. 2, the plurality of slits 132 are formed in the solder resist layer 130 along the cut region CR that is formed in a lattice manner. The plurality of slits 132 cross one another.

Figure 3:
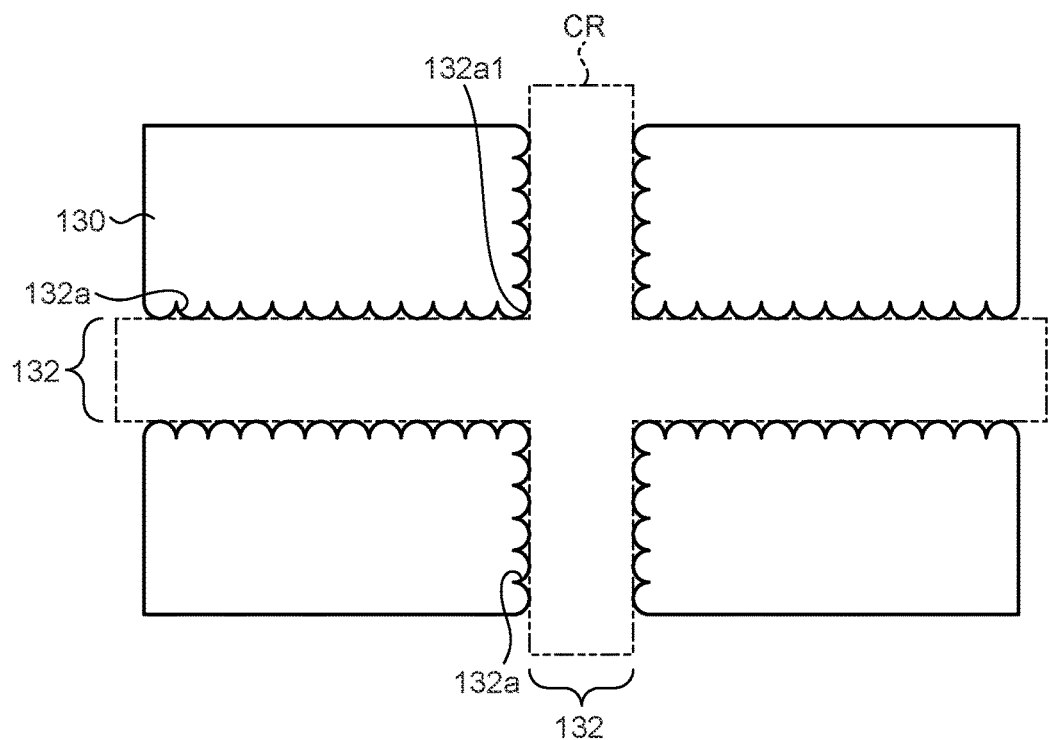
FIG. 3 is an enlarged view illustrating shapes of slits.

FIG. 3 is an enlarged view of the slits 132. In FIG. 3, an enlarged view of a portion A in FIG. 2 is illustrated. Meanwhile, the shapes of the slits 132 in the solder resist layer 130 will be described below, but the slits 142 in the solder resist layer 140 have the same shapes as the slits 132.

As illustrated in FIG. 3, edge portions 132a of the solder resist layer 130 corresponding to edge portions of the slits 132 are formed so as to meander in a wave-like manner. In the solder resist layer 130 in which the edge portions 132a meander in a wave-like manner, a contact area between the solder resist layer 130 and a periphery of the cut region CR on the surface of the wiring structure 120 is small as compared to a solder resist layer in which edge portions do not meander, so that a frictional force that acts on the solder resist layer 130 from the cutting tool is reduced.

In other words, when the wiring structure is cut by the cutting tool in the cut region CR that is exposed from the slits 132, the edge portions 132a of the solder resist layer 130 corresponding to the edge portions of the slits 132 come into contact with the cutting tool. In this case, the edge portions 132a of the solder resist layer 130 meander in a wave-like manner, so that a frictional force that acts on the solder resist layer 130 from the cutting tool is relatively small, and a load that acts on the solder resist layer 130 from the cutting tool is not match increased. As a result, it is possible to prevent occurrence of damage and detachment of the solder resist layer 130. Further, it is possible to prevent detachment of the solder resist layer 130, so that it is possible to maintain adhesiveness between the surface of the wiring structure 120 and the solder resist layer 130 on the outside of the cut region CR. Furthermore, the wiring structure 120 is protected by the solder resist layer 130, so that it is possible to prevent chipping or cracking on the surface of the wiring structure 120.

Moreover, the edge portions 132a of the solder resist layer 130 corresponding to the edge portions of the slits 132 meander in a wave-like manner so as to include a plurality of circular arcs that are connected to one another. Specifically, the edge portions 132a of the solder resist layer 130 are configured by connecting a plurality of protruding portions of semi-circular arcs. The edge portions 132a of the solder resist layer 130 corresponding to the edge portions of the slits 132 meander in a wave-like manner so as to include a plurality of circular arcs that are connected to one another, so that a contact area between the solder resist layer 130 and the periphery of the cut region CR on the surface of the wiring structure 120 is reduced.

Furthermore, the plurality of protruding portions included in the edge portions 132a of the solder resist layer 130 have vertices at positions that come into contact with the periphery of the cut region CR. With this configuration, it is possible to minimize the contact area between the solder resist layer 130 and the periphery of the cut region CR on the surface of the wiring structure 120.

Moreover, at least one protruding portion 132a1 among the plurality of protruding portions included in the edge portions 132a of the solder resist layer 130 is located so as to face a corner portion that is formed by the plurality of slits 132 that cross each other. With this configuration, in the vicinity of the corner portion that is formed by the plurality of slits 132 that cross each other, it is possible to prevent occurrence of detachment between the solder resist layer 130 and the wiring structure 120, so that it is possible to maintain adhesiveness between the surface of the wiring structure 120 and the solder resist layer 130.

Figure 4:
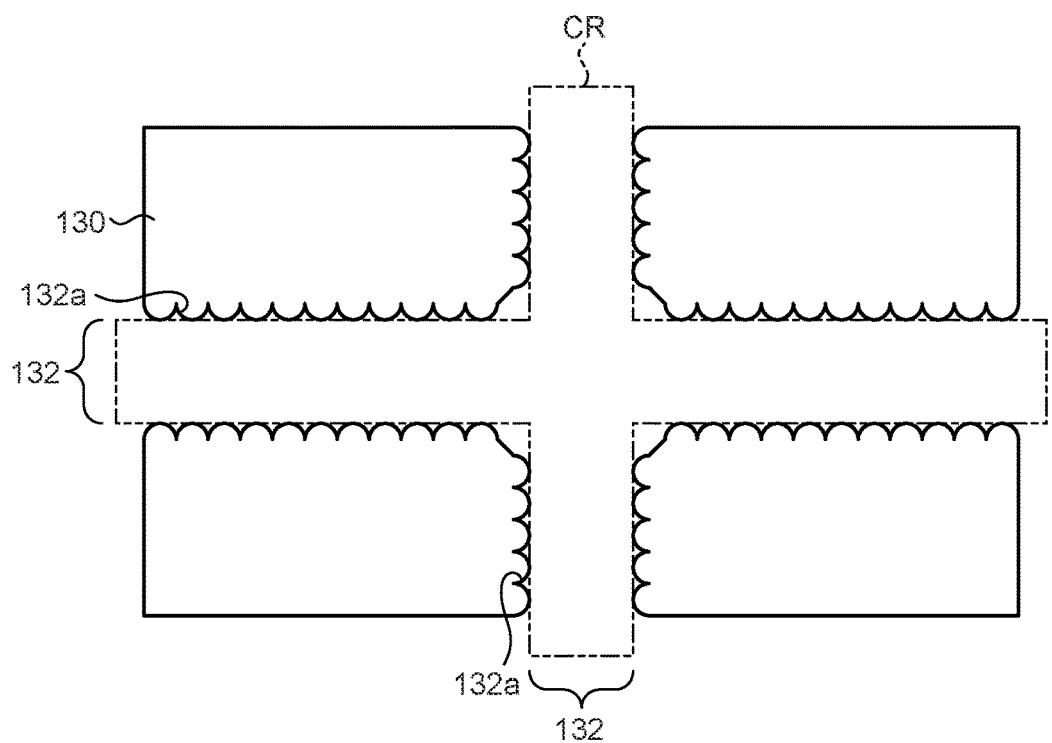
FIG. 4 is a diagram illustrating another example of shapes of edge portions of a solder resist layer.
Figure 5:
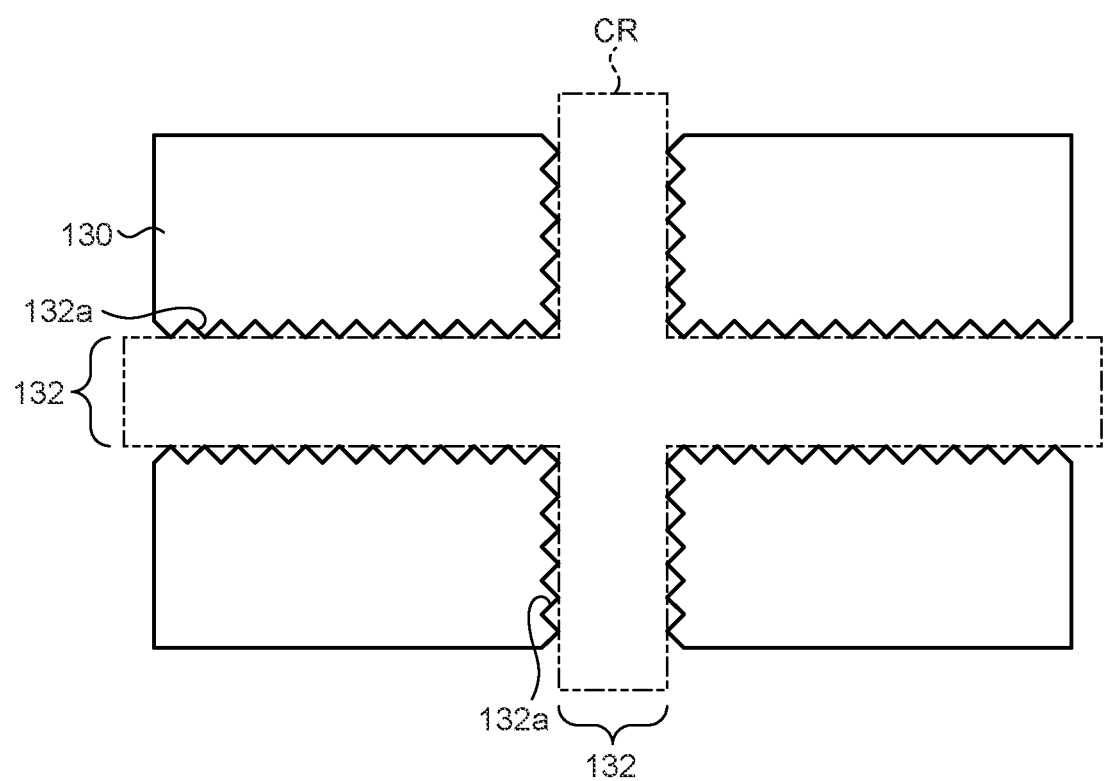
FIG. 5 is a diagram illustrating still another example of the shapes of the edge portions of the solder resist layer.

Meanwhile, the shapes of the edge portions 132a of the solder resist layer 130 corresponding to the edge portions of the slits 132 may be any other shapes as long as the edge portions meander in a wave-like manner. FIG. 4 and FIG. 5 are diagrams illustrating other examples of the shapes of the edge portions 132a of the solder resist layer 130. For example, as illustrated in FIG. 4, the shapes of the edge portions 132a of the solder resist layer 130 may be formed so as to meander in a wave-like manner and so as not to include the protruding portion 132a1 of the solder resist layer 130. In other words, the edge portions 132a of the solder resist layer 130 may have shapes in which the corner portions that face corner portions that are formed by the plurality of slits 132 that cross each other are not formed. The edge portions 132a of the solder resist layer 130 do not include the corner portions, so that it is possible to prevent detachment, chipping, and cracking of the solder resist layer 130 due to the contact with the cutting tool.

Furthermore, for example, as illustrated in FIG. 5, the edge portions 132a of the solder resist layer 130 may have wave-like shapes including triangular waves. Moreover, although not illustrated in the drawings, the edge portions 132a of the solder resist layer 130 may meander in a wave-like manner so as to include at least a single wave that is selected from among a wave that is formed by a plurality of circular arcs that are connected to one another, a triangular wave, a square wave, and a trapezoidal wave. Moreover, at least one of the protruding portions included in the edge portions 132a of the solder resist layer 130 may have a different size from at least another one of the protruding portions.

Figure 6:
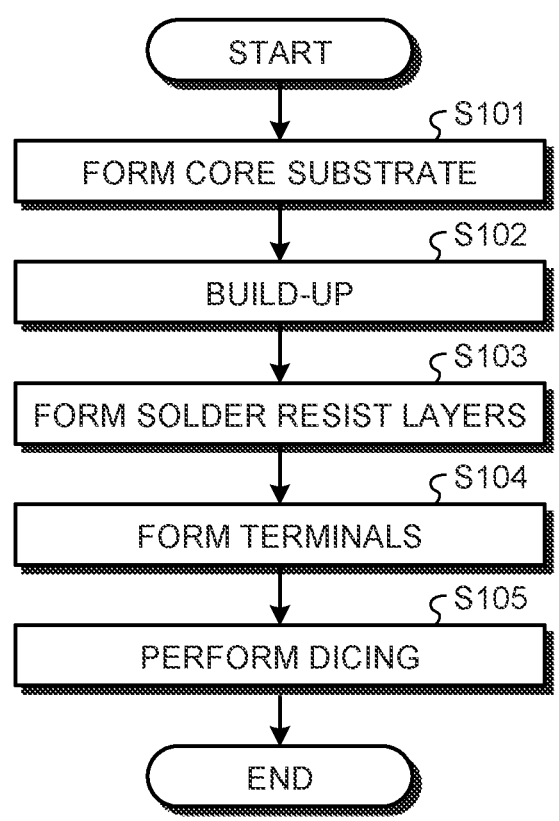
FIG. 6 is a flowchart illustrating a method of manufacturing the wiring board assembly and a wiring board according to one embodiment.

A method of manufacturing the wiring board assembly 100 and the wiring board 100a configured as described above will be described below using a specific example with reference to FIG. 6. FIG. 6 is a flowchart illustrating the method of manufacturing the wiring board assembly 100 and the wiring board 100a according to one embodiment.

Figure 7:
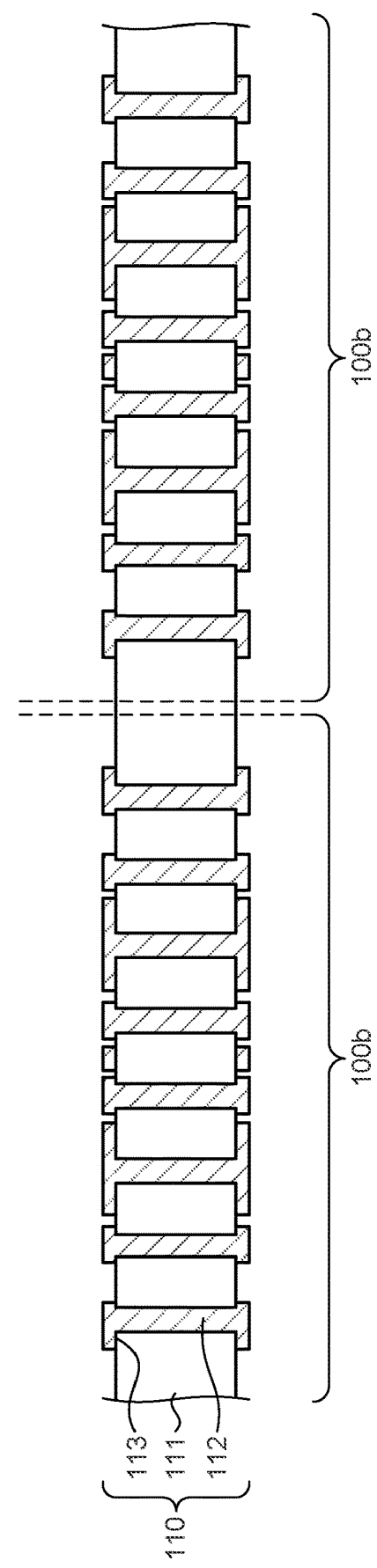
FIG. 7 is a diagram illustrating a specific example of a core substrate formation process.

First, the core substrate 110 that serves as a support member of the wiring board assembly 100 is formed (Step S101). Specifically, as illustrated in FIG. 7 for example, the vias 112 that penetrate through the base material 111 are formed on the base material 111 that is a plate-shaped insulator, and the wiring layers 113 that are made of metal, such as copper, are formed on the both surfaces of the base material 111 by copper foil plating or copper plating. FIG. 7 is a diagram illustrating a specific example of a core substrate formation process. The wiring layers 113 on the both surfaces of the base material 111 are connected to each other via the vias 112 that are formed by metal plating, such as copper plating, on an as-needed basis. As the base material 111, for example, a material that is obtained by impregnating insulating resin, such as epoxy resin, into a reinforcing member, such as a glass fabric, may be used. As the reinforcing member, a glass non-woven fabric, an aramid fabric, or an aramid non-woven fabric may be used instead of the glass fabric. Further, as the insulating resin, polyimide resin, cyanate resin, or the like may be used instead of epoxy resin.

Meanwhile, a plurality of wiring board formation regions 100b that are adjacent to each other at certain intervals that are the same as the width of the cut region are formed on a top surface and a bottom surface of the core substrate 110, and the wiring board 100a is formed on each of the wiring board formation regions 100b. In other words, the plurality of wiring boards 100a are formed by using the single core substrate 110.

Figure 8:
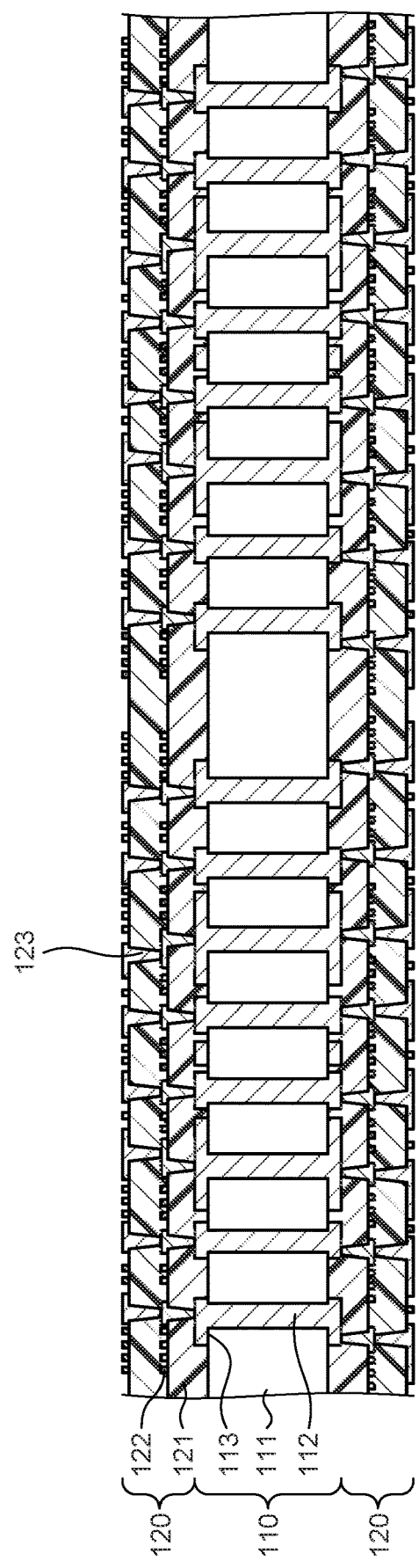
FIG. 8 is a diagram illustrating a specific example of a build-up process.

Further, the wiring structures 120 are formed on the top surface and the bottom surface of the core substrate 110 by a build-up method (Step S102). Specifically, as illustrated in FIG. 8 for example, the insulating layers 121 are formed on the top surface and the bottom surface of the core substrate 110, and the wiring layers 122 are formed on the surfaces of the insulating layers 121. FIG. 8 is a diagram illustrating a specific example of a build-up process. The insulating layers 121 are formed by using, for example, insulating resin, such as epoxy resin or polyimide resin. Furthermore, the wiring layers 122 are formed by metal plating, such as copper plating, for example.

The wiring layer 113 of the core substrate 110 and the wiring layer 122 or the wiring layers 122 in the adjacent layers are connected to each other via the vias 123 that are formed by metal plating, such as copper plating, on an as-needed basis. It may be possible to laminate the plurality of insulating layers 121 and the plurality of wiring layers 122 on each of the top surface and the bottom surface of the core substrate 110.

After the wiring structures 120 are formed, the wiring layers 122 on the surfaces of the wiring structures 120 are covered by the solder resist layers 130 and 140 (Step S103). Specifically, the wiring layer 122 on the surface of the wiring structure 120 that is laminated on the top surface of the core substrate 110 is covered by the solder resist layer 130, and the wiring layer 122 on the surface of the wiring structure 120 that is laminated on the bottom surface of the core substrate 110 is covered by the solder resist layer 140.

Figure 9:
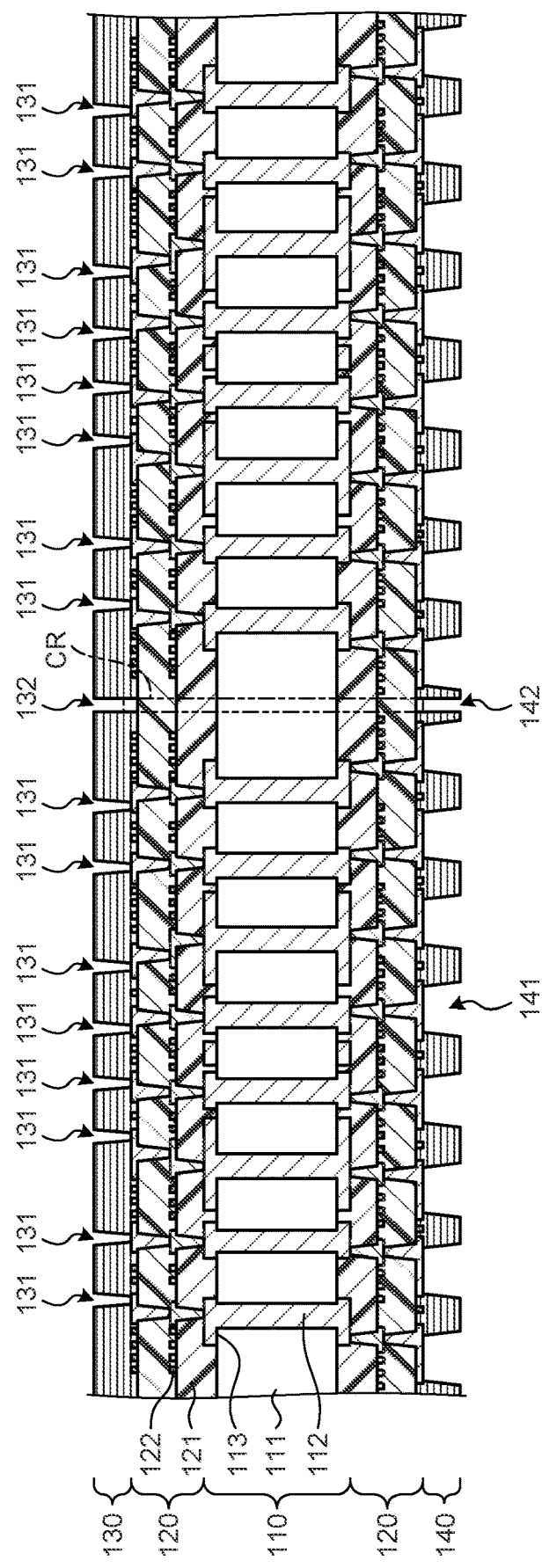
FIG. 9 is a diagram illustrating a specific example of a solder resist layer formation process.

Then, as illustrated in FIG. 9 for example, in the solder resist layer 130 at the side at which a semiconductor chip is to be mounted, the opening portions 131 are formed at positions at which connecting terminals for the semiconductor chip are arranged. At bottoms of the opening portions 131, the wiring layer 122 on the surface of the wiring structure 120 is exposed. FIG. 9 is a diagram illustrating a specific example of a solder resist layer formation process. Further, in the solder resist layer 130, the slits 132 are formed at positions corresponding to the cut region CR on the surface of the wiring structure 120. At bottoms of the slits 132, the cut region CR on the surface of the wiring structure 120 is exposed.

In contrast, in the solder resist layer 140 at a side at which an external component or an external apparatus is to be connected, the opening portions 141 are formed at positions at which external connecting terminals are arranged. At bottoms of the opening portions 141, the wiring layer 122 on the surface of the wiring structure 120 is exposed. Further, in the solder resist layer 140, the slits 142 are formed at positions corresponding to the cut region CR on the surface of the wiring structure 120. At the bottoms of the slits 142, the cut region CR on the surface of the wiring structure 120 is exposed.

Photosensitive resin is used as the solder resist layers 130 and 140, so that it is possible to simultaneously form the opening portions 131 and the slits 132 or the opening portions 141 and the slits 142 by exposure and development. Further, exposure and development on the solder resist layer 130 and exposure and development on the solder resist layer 140 may be performed individually.

Figure 10:
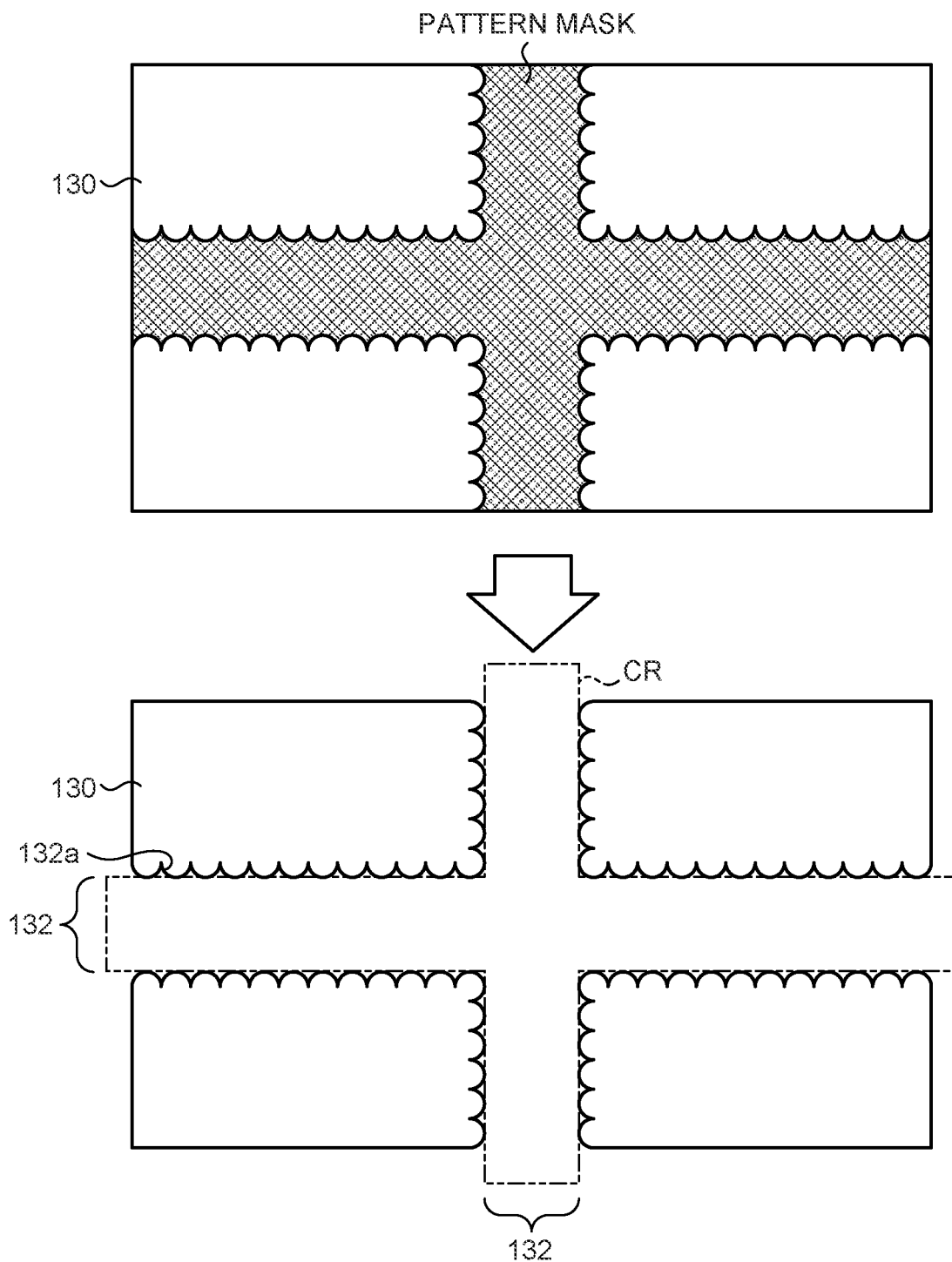
FIG. 10 is a diagram for explaining formation of the slits.

FIG. 10 is a diagram illustrating formation of the slits 132. As illustrated in an upper part in FIG. 10 for example, a pattern mask is formed on the surface of the solder resist layer 130 in accordance with the shapes of the slits 132 (and the opening portions 131), and the solder resist layer 130 in a portion in which the pattern mask is not formed is cured by exposure. Specifically, the solder resist layer 130 is cured in a region in which the slits 132 (and the opening portions 131) are not formed. The portion that is cured in the solder resist layer 130 by exposure is a remaining portion that remains after development.

If the solder resist layer 130 is cured by exposure, development is performed, and only the remaining portion that is cured remains on the surface of the wiring structure 120. In other words, as illustrated in a lower part in FIG. 10 for example, the remaining portion of the solder resist layer 130 covers the surface of the wiring structure 120, and the slits 132 that expose the cut region CR on the surface of the wiring structure 120 are formed in portions other than the remaining portion. The edge portions 132a of the solder resist layer 130 that correspond to the edge portions of the slits 132 meander in a wave-like manner.

Figure 11:
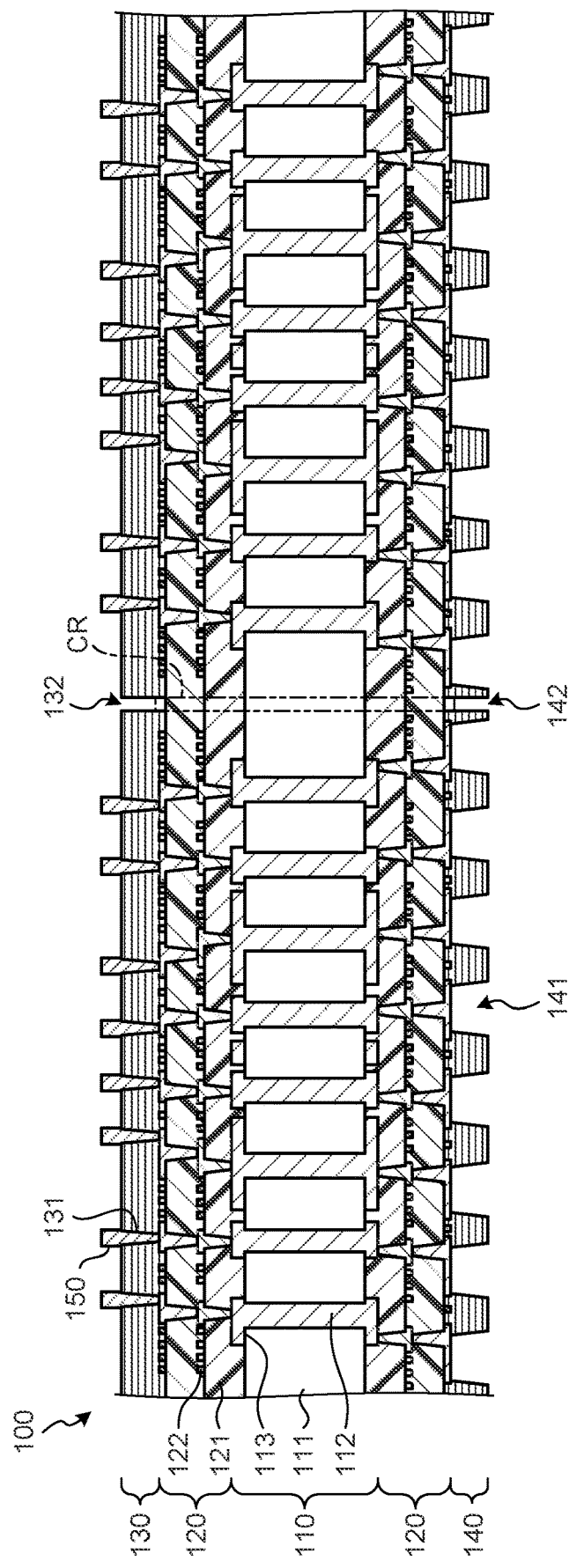
FIG. 11 is a diagram illustrating a specific example of a terminal formation process.

Further, connecting terminals for connecting a semiconductor chip are formed in the opening portions 131 of the solder resist layer 130 (Step S104). Specifically, the connecting terminals 150 are formed by, for example, copper plating in the opening portions 131. Through the process as described above, as illustrated in FIG. 11 for example, the wiring board assembly 100 including the plurality of wiring boards 100a is obtained. FIG. 11 is a diagram illustrating a specific example of a terminal formation process. Meanwhile, a semiconductor chip may be mounted at the side of the solder resist layer 130 if needed, and the connecting terminals 150 and electrodes of the semiconductor chip may be bonded by, for example, solder or the like.

Further, dicing for separating each of the wiring boards 100a is performed (Step S105). Specifically, the wiring board assembly 100 as illustrated in FIG. 11 is cut by the cutting tool, such as a dicer or a slicer, in the cut region CR that is exposed from the slits 132, so that the plurality of wiring boards 100a are obtained. At this time, the edge portions 132a of the solder resist layer 130 (see FIG. 3) that correspond to the edge portions of the slits 132 meander in a wave-like manner, so that a frictional force that acts on the solder resist layer 130 from the cutting tool is relatively small, and a load that acts on the solder resist layer 130 from the cutting tool is not much increased. As a result, it is possible to prevent occurrence of damage and detachment of the solder resist layer 130. Furthermore, it is possible to prevent detachment of the solder resist layer 130, so that it is possible to maintain adhesiveness between the surface of the wiring structure 120 and the solder resist layer 130 on the outside of the cut region CR. Moreover, the wiring structure 120 is protected by the solder resist layer 130, so that it is possible to prevent chipping or cracking on the surface of the wiring structure 120.

Figure 12:
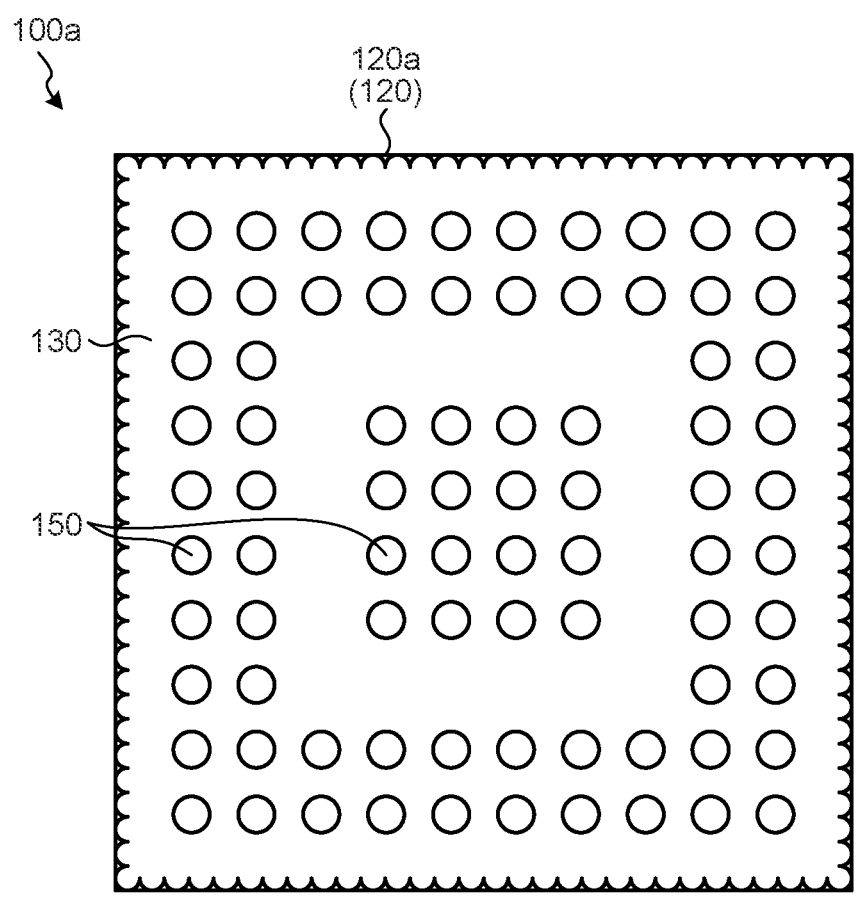
FIG. 12 is a plan view illustrating a configuration of a wiring board according to one embodiment.

In each of the wiring boards 100a, as illustrated in FIG. 12 for example, side surfaces of the solder resist layer 130 are formed along a periphery 120a of the surface of the wiring structure 120 and meander in a wave-like manner.

FIG. 12 is a plan view illustrating a configuration of the wiring board 100a according to one embodiment. Meanwhile, although not illustrated in the drawing, in each of the wiring boards 100a, side surfaces of the solder resist layer 140 are formed along the periphery 120a of the surface of the wiring structure 120 and meander in a wave-like manner, similarly to the side surfaces of the solder resist layer 130.

As described above, a wiring board assembly (for example, the wiring board assembly 100) according to one embodiment includes a wiring structure (for example, the wiring structure 120), and an outermost insulating layer (for example, the solder resist layers 130 and 140). The wiring structure includes a wiring layer (for example, the wiring layer 122) and an insulating layer (for example, the insulating layer 121). The outermost insulating layer covers a surface of the wiring structure and includes a slit (for example, the slits 132 and 142) that exposes a predetermined region (for example, the cut region CR) on the surface of the wiring structure. An edge portion of the outermost insulating layer corresponding to an edge portion of the slit meanders in a wave-like manner. With this configuration, according to the wiring board assembly of one embodiment, it is possible to prevent occurrence of damage and detachment at the time of cutting.

Furthermore, the edge portion of the outermost insulating layer corresponding to the edge portion of the slit may meander in a wave-like manner so as to include at least a single wave that is selected from among a wave that is formed by a plurality of circular arcs that are connected to one another, a triangular wave, a square wave, and a trapezoidal wave. With this configuration, according to the wiring board assembly of one embodiment, a contact area between the surface of the outermost insulating layer (for example, the solder resist layers 130 and 140) and a periphery of the cut region on the surface of the wiring structure is reduced. Further, according to the wiring board assembly of one embodiment, it is possible to prevent chipping and cracking on a top surface of the wiring structure as compared to a conventional example in which an outer periphery is not covered by the outermost insulating layer.

Moreover, a plurality of protruding portions included in the edge portion of the outermost insulating layer may have vertices at positions that come into contact with a periphery of a predetermined region. With this configuration, according to the wiring board assembly of one embodiment, it is possible to minimize a contact area between the outermost insulating layer (for example, the solder resist layers 130 and 140) and the periphery of the cut region on the surface of the wiring structure.

Furthermore, at least one of the protruding portions included in the edge portion of the outermost insulating layer may have a different size from at least another one of the protruding portions. With this configuration, according to the wiring board assembly according to one embodiment, it is possible to further prevent occurrence of damage and detachment at the time of cutting.

Moreover, the outermost insulating layer may include a plurality of slits that cross one another. At least one (for example, the protruding portion 132a1) of the protruding portions included in the edge portion of the outermost insulating layer corresponding to the edge portion of the slit may be located so as to face a corner portion that is formed by the plurality of slits that cross each other. With this configuration, according to the wiring board assembly of one embodiment, in the vicinity of the corner portion that is formed by the plurality of slits that cross each other, it is possible to prevent occurrence of detachment between the outermost insulating layer (for example, the solder resist layers 130 and 140) and the wiring structure.

According to one embodiment of the wiring board assembly disclosed in the present application, it is possible to prevent occurrence of damage and detachment at the time of cutting.

With respect to the embodiment described above, the following note is further disclosed.

(Note) A wiring board manufacturing method comprising:
   forming a wiring structure that includes a wiring layer and an insulating layer;
   forming an outermost insulating layer that covers a surface of the wiring structure and includes a slit that exposes a predetermined region on the surface of the wiring structure; and
   cutting and dicing the wiring structure into individual pieces in the predetermined region that is exposed from the slit, wherein
   the forming the outermost insulating layer includes forming an edge portion of the outermost insulating layer corresponding to an edge portion of the slit so as to meander in a wave-like manner.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A wiring board assembly comprising:
   a wiring structure that includes a wiring layer and an insulating layer; and
   an outermost insulating layer that covers a surface of the wiring structure and includes a slit that exposes a predetermined region on the surface of the wiring structure,
   wherein
   an edge portion of the outermost insulating layer corresponding to an edge portion of the slit meanders in a wave shape so as to include at least a single wave that is selected from among a wave that is formed by a plurality of circular arcs that are connected to one another, a triangular wave, a square wave, and a trapezoidal wave,
   the insulating layer located at the surface of the wiring structure is exposed between a plurality of protruding portions included in the edge portion of the outermost insulating layer,
   the plurality of protruding portions included in the edge portion of the outermost insulating layer have vertices located at positions that come into contact with a periphery of the predetermined region and bases located inside the periphery of the predetermined region, and
   contour lines of the bases of adjacent protruding portions among the plurality of protruding portions intersect each other inside the periphery of the predetermined region in plan view.

2. The wiring board assembly according to claim 1, wherein at least one of the plurality of protruding portions included in the edge portion of the outermost insulating layer has a different size from at least another one of the plurality of protruding portions.

3. The wiring board assembly according to claim 1, wherein
   the outermost insulating layer includes a plurality of the slits that cross one another, and
   at least one of the plurality of protruding portions included in the edge portion of the outermost insulating layer is located so as to face a corner portion that is formed by the plurality of the slits that cross each other.

4. The wiring board assembly according to claim 1, wherein the insulating layer located at the surface of the wiring structure on which the outermost insulating layer is formed and which is covered by the outermost insulating layer, is exposed between the plurality of protruding portions included in the edge portion of the outermost insulating layer.

5. A wiring board comprising:
   a wiring structure that includes a wiring layer and an insulating layer; and
   an outermost insulating layer that covers a surface of the wiring structure,
   wherein
   the outermost insulating layer includes a side surface that is formed along a periphery of the surface of the wiring structure and that meanders in a wave shape so as to include at least a single wave that is selected from among a wave that is formed by a plurality of circular arcs that are connected to one another, a triangular wave, a square wave, and a trapezoidal wave,
   the insulating layer located at the surface of the wiring structure is exposed between a plurality of protruding portions included in the side surface of the outermost insulating layer,
   the plurality of protruding portions included in the side surface of the outermost insulating layer have vertices located at positions that come into contact with the periphery of the surface of the wiring structure and bases located inside the periphery of the surface of the wiring structure, and
   contour lines of the bases of adjacent protruding portions among the plurality of protruding portions intersect each other inside the periphery of the surface of the wiring structure in plan view.

6. The wiring board according to claim 5, wherein at least one of the plurality of protruding portions included in the side surface of the outermost insulating layer has a different size from at least another one of the plurality of protruding portions.

7. The wiring board according to claim 5, wherein the insulating layer located at the surface of the wiring structure on which the outermost insulating layer is formed and which is covered by the outermost insulating layer, is exposed between the plurality of protruding portions included in the side surface of the outermost insulating layer.

* * * * *